(12) United States Patent
Zou et al.

(10) Patent No.: US 12,074,608 B2
(45) Date of Patent: Aug. 27, 2024

(54) OPTICAL SAMPLING SIGNAL HOLDING METHOD FOR PHOTONIC ANALOG-TO-DIGITAL CONVERSION SYSTEM

(71) Applicant: Shanghai Jiao Tong University, Shanghai (CN)

(72) Inventors: Weiwen Zou, Shanghai (CN); Shiyu Hua, Shanghai (CN); Na Qian, Shanghai (CN)

(73) Assignee: Shanghai Jiao Tong University, Shanghai (CN)

( * ) Notice: Subject to any disclaimer, the term of this patent is extended or adjusted under 35 U.S.C. 154(b) by 195 days.

(21) Appl. No.: 17/941,006

(22) Filed: Sep. 8, 2022

(65) Prior Publication Data
US 2023/0378969 A1   Nov. 23, 2023

(30) Foreign Application Priority Data
May 18, 2022   (CN) .......................... 202210596205.5

(51) Int. Cl.
*H03M 1/00* (2006.01)
*H03M 1/12* (2006.01)

(52) U.S. Cl.
CPC ......... *H03M 1/1245* (2013.01); *H03M 1/121* (2013.01)

(58) Field of Classification Search
CPC ........................... H03M 1/1245; H03M 1/121
USPC ........................................................ 341/137
See application file for complete search history.

(56) References Cited

U.S. PATENT DOCUMENTS

2004/0136413 A1*  7/2004  Kallmann ............ H04B 10/504
                                                              372/20
2010/0201345 A1*  8/2010  Gupta ................. H03M 1/1042
                                                              341/137

OTHER PUBLICATIONS

F. Su, et al., "Effects of the photonic sampling pulse width and the photodetection bandwidth on the channel response of photonic ADCs," Optics express, vol. 24, No. 2, pp. 924-934 (2016).
Z. Jin, et al., "Equalization based inter symbol interference mitigation for time-interleaved photonic analog-to-digital converters," Optics Express, vol. 26, No. 26, pp. 34373-34383 (2018).

* cited by examiner

*Primary Examiner* — Peguy Jean Pierre
(74) *Attorney, Agent, or Firm* — Mei & Mark LLP; Manni Li

(57) ABSTRACT

An optical sampling signal holding method for a photonic analog-to-digital conversion system, based on frequency response principles of sampling and holding, controls photoelectric conversion processes after photonic sampling to be equivalent to the signal holding effect in switch sampling, and converts sampled optical pulses into a special holding waveform, directly eliminating the time mismatch between back-end electronic analog-to-digital converters and optical pulses. The photoelectric conversion frequency responses in the invention do not lead to additional expenses on active devices and software, which greatly improves performances of the photonic analog-to-digital conversion system. The method is not limited by the number of channels, and can provide more reliable technical solutions for realizing a photonic analog-to-digital conversion system with high sampling rate in the future.

6 Claims, 4 Drawing Sheets

OPTICAL SAMPLING SIGNAL HOLDING METHOD FOR PHOTONIC ANALOG-TO-DIGITAL CONVERSION SYSTEM

CROSS-REFERENCE TO RELATED APPLICATIONS

The subject application claims priority on Chinese Application No. 202210596205.5 filed on May 18, 2022 in China. The contents and subject matter of the Chinese priority application is incorporated herein by reference.

TECHNICAL FIELD

The present invention relates to photonic information processing, specifically to an optical sampling signal holding method for photonic analog-to-digital conversion system.

BACKGROUND ART

Photonic analog-to-digital conversion technology is an effective means to overcome performance bottlenecks of traditional electronic analog-to-digital converters. Among many types of photonic analog-to-digital conversion technologies, the optical sampling electronically-quantified photonic analog-to-digital conversion technology combines advantages of photonic sampling (ultra-low jitter of mode-locked lasers and ultra-large bandwidth of modulators, etc.) and electronic quantification (high precision and mature technology, etc.) and has made great progress and moved towards practicality. The photonic multi-channel demultiplexing technology thereof enables multiple parallel electronic analog-to-digital converters to operate at lower clock frequencies, yet still achieves high sampling rate wholly. In the solution, the photodetector is an important device combining a photonic sampling part and an electronic quantification part, and its frequency response has been discussed by many researchers. Based on low-pass filtering models, researchers have studied the influence of the photodetection bandwidth on frequency responses of an entire photonic analog-to-digital conversion system and the influence on the electronic sampling clock jitter and pointed out that the bandwidth of a photodetector have been set to be half of the sampling rate of a single channel. See F. Su, et al., "Effects of the photonic sampling pulse width and the photodetection bandwidth on the channel response of photonic ADCs," Optics express, Vol. 24, No. 2, pp. 924-934 (2016). On the basis, some researchers have made sampled optical pulses equivalent to digital symbols and corrected problems such as inter symbol interference resulting from the low-pass filtering of the sampled pulses by means of digital compensation, etc., to improve the flatness of the frequency responses of the system. See Z. Jin, et al., "Equalization based inter symbol interference mitigation for time-interleaved photonic analog-to-digital converters," Optics Express, Vol. 26, No. 26, pp. 34373-34383 (2018). However, the signal holding effect of photodetectors on the photonic analog-to-digital conversion system is ignored, and the signal holding effect can directly eliminate a delay mismatch between photonic sampling and electronic quantification.

Traditional electronic analog-to-digital converters all contain at least one sampling and holding circuit to ensure that input signals are constant during the analog-to-digital conversion, thereby ensuring the accuracy of output data. The sampling and holding circuit enables the analog-to-digital converters to process fast-changing high-frequency signals, and post-stage encoders can complete accurate analog-to-digital conversion processes at any time within holding windows. However, the existing photonic analog-to-digital conversion technologies lack a sampling and holding device. A photonic clock used for sampling is a series of very narrow pulse sequences in time domain, and even if they can be decomposed into multiple channels of low-speed pulses by techniques such as time-wavelength interleaving or channel interleaving, the original sampling points still exist at the vertex of a single pulse. It is usually difficult for back-end electronically-quantified analog-to-digital converters to precisely match positions of the pulse vertexes, resulting in spurious mismatch. In a solution using a higher rate and more channels, it is often difficult to further improve its digital quantification accuracy, largely due to the deterioration of digital quantification results by the time mismatch introduced in each channel during the electronic quantification processes. On the other hand, the current time mismatch compensation methods mostly use for reference channel mismatch compensation principles adopted in the electronic analog-to-digital conversion technologies and need to consume a lot of software and hardware resources for mismatch extraction and compensation, which is not conducive for the photonic analog-to-digital conversion technologies to further give full play to the advantages of high-speed and high-precision. Therefore, in order to achieve a photonic analog-to-digital conversion with high-speed and high-precision, a low-complexity method is required to efficiently eliminate the time mismatch.

SUMMARY OF THE INVENTION

The present invention provides photodetection and sampling and holding methods in a photonic analog-to-digital conversion system to overcome the shortcomings of the current technology. The method of the present invention is specifically performed by using frequency responses of photodetectors to selectively retain and filter out high-frequency components of signals generated by optical pulse sampling. The high-frequency components are folded back to signal frequency positions when quantified by electronic analog-to-digital converters of the same rate, which is equivalent to creating a time offset opposite to a time mismatch to counteract the time mismatch existing in the system, so as to finally obtain a correct output without time mismatch. Only by controlling the frequency responses of the photoelectric conversion, a time offset amount that is always opposite to the time mismatch can be created before quantification, thereby suppressing fundamentally the generation of the time mismatch. The method of the present invention only relates to the optical pulse rate but not the number of channels used in the system; further the method does not need to perform complex error extraction and compensation operations for each channel. Therefore, the photonic analog-to-digital conversion technologies can improve the sampling rate of the system while ensuring that the digital quantification accuracy is not deteriorated by the time mismatch. The method of the present invention becomes the most easily-realized and practical solution for the high-speed and high-precision photonic analog-to-digital conversion system.

The principles of the present invention are as follows.

In the photonic analog-to-digital conversion system with optical pulses as sampling media, no matter whether there is a demultiplexing process or not in a channel, it is assumed that a sampled signal is a single-tone signal with a frequency of $f_{in}$; the signal is directly sampled by an optical pulse with a repetition frequency of $F_s$, so as to result in a periodic extension in spectrum and generate many high-frequency components other than the original signal; and these high-frequency components exist symmetrically with the multiple of the optical pulse sampling rate as a center. The frequency is expressed as $kF_s \pm f_{in}$, the output $v_{out}(t)$ after passing through a photodetector with the pulse response of $h_{OE}(t)$ is shown in the following formula (1), and its frequency domain is shown in FIG. 2A, $$v_{out}(t) = \{\cos(2\pi f_{in} t) + \sum_{k=1}^{+\infty} \{\cos[2\pi(kF_s - f_{in})t] + \cos[2\pi(kF_s + f_{in})t]\}\} * h_{OE}(t) \quad (1)$$

wherein k is positive integer greater than or equal to 1, and phase symbols of each pair of high-frequency components are opposite to each other. Ideally, a back-end electronic analog-to-digital converter collects the pulse vertex at the same sampling rate, i.e., specifying $t=nT_s$, wherein n is integer greater than or equal to zero. In the data obtained by the final sampling, the high-frequency components in an analog signal are all folded back into the Nyquist interval without any phase offset. The expression of the folding processes is shown in the following formula (2):

$$\cos[2\pi(kF_s \pm f_{in})t]|_{t=nT_s} = \cos(2\pi f_d t)|_{t=nT_s} \quad (2)$$

wherein $f_d$ is digital frequency within the Nyquist bandwidth. However, in practical situations, there is usually an arbitrary delay mismatch $\tau$ between an electronic analog-to-digital converter and an optical pulse, and there is the time mismatch $\tau$ in the phases of the high-frequency components folded back to the Nyquist interval after sampling, as shown in the following formula (3), and the frequency domain process is shown in FIG. 2B:

$$\cos[2\pi(kF_s \pm f_{in})t]|_{t=nT_s+\tau} = \cos(2\pi f_d t \pm 2\pi kF_s \tau)|_{t=nT_s+96} \quad (3)$$

The result of the superposition of these high-frequency components with the original signal in the baseband is a signal vector with the same frequency but changed phase, which is equivalent to a new signal vector collected by an electronic analog-to-digital converter with time mismatch, the finally obtained digital sampling sequence $y_{out}(n)$ is shown in the following formula (4), and the calculation process of their vector superposition is shown in FIG. 2C:

$$y_{out}(n) = v_{out}(t)|_{nT_s+\tau} \quad (4)$$
$$= \{H_{OE}(f_d)\cos(2\pi f_d t) +$$
$$\sum_{k=1}^{+\infty} H_{OE}(kF_s - f_d)\cos(2\pi f_d t - 2\pi kF_s \tau) +$$
$$\sum_{k=1}^{+\infty} H_{OE}(kF_s + f_d)\cos(2\pi f_d t + 2\pi kF_s \tau)\}|_{t=nT_s+\tau}$$
$$= A_{eff} \cos(2\pi f_d(t - \tau_{eff}))|_{t=nT_s+\tau}$$

wherein the original signal is translated by an equivalent delay $\tau_{eff}$, which is calculated based on operation rules of vector addition. As shown in FIG. 2C, the amplitude change of a superimposed signal can be removed by simple calibration or normalization. The equivalent delay $\tau_{eff}$ of the signal is shown in the following formula (5):

$$\tau_{eff} = \frac{\tan^{-1}\left(\begin{array}{c} H_{OE}(f_d)\sin(0) + \\ \sum_{k=1}^{+\infty}[H_{OE}(kF_s - f_d)\sin(-2\pi kF_s \tau) + \\ H_{OE}(kF_s + f_d)\sin(2\pi kF_s \tau)] \\ \hline H_{OE}(f_d)\cos(0) + \\ \sum_{k=1}^{+\infty}[H_{OE}(kF_s - f_d)\cos(-2\pi kF_s \tau) + \\ H_{OE}(kF_s + f_d)\cos(2\pi kF_s \tau)] \end{array}\right)}{2\pi f_d} \quad (5)$$

wherein $H_{OE}(f)$ is a photodetector with controlled frequency response. By controlling magnitudes of these high-frequency components, the equivalent delay $\tau_{eff}$ is controlled to counteract the original time mismatch $\tau$ or decrease to an order of magnitude insufficient to affect the system performances.

Formula (5) shows that the high-frequency components exist in pairs outside the Nyquist bandwidth. In the traditional low-pass filter response, the high-frequency components are either completely filtered out or retained in pairs, and then the equivalent delay $\tau_{eff}$ identically equal to zero. The present invention provides the type of photoelectric conversion response whose amplitude-frequency response function can be regarded as a combination of a rectangular window function and a triangular window function. The frequency response remains constant within $0.5F_s$, decays triangularly to zero outside $0.5F_s$, and has a 3 dB bandwidth which is an integral multiple of the sampling rate $F_s$. The larger the bandwidth, the more high frequency components are retained. The frequency response of the type is shown in the following formula (6):

$$|H_{OE}(f)| = \begin{cases} 1, & \text{if } 0 \le f \le \frac{1}{2} \cdot F_S \\ 1 - \frac{1}{m \cdot F_S} \cdot (f - \frac{1}{2} \cdot F_S), & \text{if } \frac{1}{2} \cdot F_S \le f \le m \cdot F_S + \frac{1}{2} \cdot F_S \\ 0, & \text{otherwise} \end{cases} \quad (6)$$

wherein f is independent variable of the frequency response expression, m is the number of the retained high-frequency component pairs, and the 3 dB bandwidth of the frequency response of the type is $(m+1)*F_s/2$. The more high-frequency component pairs are retained, the closer the equivalent delay $\tau_{eff}$ of the signal is to the delay mismatch $\tau$, but the larger its bandwidth, the more difficult it is to achieve. In addition, in practical situations, the delay mismatch is usually a very small amount at the ps level. Therefore, in general, selecting 1 for m can achieve a certain holding effect, or a positive integer greater than 1 can also be selected for m according to actual situations. Methods for using the frequency response in the system include, but are not limited to, directly designing the responses of the photodetectors, or adding filters that conform to the responses after photodetectors with large bandwidth. The photodetectors with controlled frequency responses broaden the sampled narrow pulses into approximately ideal triangular waveforms whose vertex amplitudes are equal to the amplitudes of the sampling points. At the time, any time mismatch $\tau$ only causes the up and down translations of the amplitudes of the original pulse vertexes, which is embodied as an easy-to-eliminate direct-current component in the final recovery data, to achieve the signal holding effect, thereby counteracting the time mismatch.

An optical sampling signal holding method in a photonic analog-to-digital conversion system of the present invention comprises the following steps:

(1) assuming that sampled signals are single-tone signals with a frequency of $f_{in}$, sampling the signals by optical pulses with a repetition frequency of $F_s$, so as to result in a periodic extension in spectrum and generate many high-frequency components other than the original signals; these high-frequency components exist symmetrically with the multiple of the optical pulse sampling rate as a center, and the frequency is $kF_s \pm f_{in}$;

(2) controlling the frequency responses $|H_{OE}(f)|$ of the photodetectors, as shown in the following formula (6):

$$|H_{OE}(f)| = \begin{cases} 1, & \text{if } 0 \le f \le \frac{1}{2} \cdot F_S \\ 1 - \frac{1}{m \cdot F_S} \cdot (f - \frac{1}{2} \cdot F_S), & \text{if } \frac{1}{2} \cdot F_S \le f \le m \cdot F_S + \frac{1}{2} \cdot F_S \\ 0, & \text{otherwise} \end{cases} \quad (6)$$

wherein f is an independent variable of the frequency response expression, m is the number of the retained high-frequency component pairs, and the 3 dB bandwidths of the frequency responses of the type are $(m+1)*F_s/2$. The more high-frequency component pairs are retained, the closer the equivalent delay $\tau_{eff}$ of the signals is to the delay mismatch $\tau$, but the larger their bandwidths, the more difficult it is to achieve. In addition, in practical situations, the delay mismatch is usually a very small amount at the ps level. Therefore, in general, selecting 1 for m can achieve a certain holding effect, or a positive integer greater than 1 can also be selected for m according to actual situations. Methods for using the frequency response in the system include, but are not limited to, directly designing the responses of the photodetectors, or adding filters that conform to the responses after the photodetectors with large bandwidth;

(3) inputting the optical pulses into the photodetectors with controlled frequency response to obtain the held electrical signals, which are passed through the electronic analog-to-digital converters to obtain electrical digital signals.

The present invention has the following advantages over the current technology:

1. Based on the principles of the present invention, an approximate signal holding effect after sampling is achieved by controlling the amplitude-frequency responses of the photoelectric conversion, so that the signals after optical sampling are more accurate when quantified electronically, and the original signals can also be recovered even if there is a certain time mismatch between sampling and quantification.

2. The operation of controlling the frequency responses of the photoelectric conversion in the present invention does not lead to additional expenses on active devices and software and no additional noise can be caused by selecting suitable photodetectors or adding filters after the original photodetectors.

3. When the number of channels of the channel-interleaved photonic analog-to-digital conversion system continues to increase, the sampling rate of a single channel decreases, and the bandwidths of the photodetectors required by the method of the present invention decrease accordingly, making it easier to realize a device with the same ideal amplitude-frequency response. Moreover, the method of the present invention is only related to the sampling rate of a single channel and not limited by the number of channels, while it can provide more reliable technical solutions for realizing a photonic analog-to-digital conversion system with high sampling rate in the future.

BRIEF DESCRIPTION OF THE DRAWINGS

FIG. 2A is a spectrum diagram showing a signal passed through a photodetector with controlled frequency response, where $A_0$ is an original signal vector, $A_1$ and $A_2$ are retained high-frequency components; FIG. 2B shows that, in the quantification process of an electronic analog-to-digital converter, the high-frequency components $A_1$ and $A_2$ of the signal are folded back to original signal positions; and FIG. 2C is a diagram showing the vector superposition of the original signal and signals of the folded-back high-frequency components, where $A_0'$ is a signal vector after equivalent time offset.

FIG. 4A shows variation of the size of the equivalent delay with time mismatch, the horizontal axis represents normalized time mismatch ($\tau$/Ts) and the vertical axis represents normalized equivalent delay ($\tau_{eff}$/Ts); and FIG. 4B shows the improvement effect of a spurious-free dynamic range, the horizontal axis represents normalized time mismatch ($\tau$/Ts), and the vertical axis represents spurious-free dynamic range (dB). In both figures, 100 is a photonic analog-to-digital conversion system using photodetectors with low-pass filtering frequency response, 200 is a photonic analog-to-digital conversion system using photodetectors with controlled frequency response, and 300 is a photonic analog-to-digital conversion system in which a time mismatch is completely suppressed under ideal conditions.

DETAILED DESCRIPTION OF THE INVENTION

One embodiment of the present invention is further described in combination with the drawings. The embodiment shows the implemented technical solutions of the present invention and provides detailed implementation modes and processes, but the scope of protection of the present invention is not limited to the embodiment.

Figure 1:
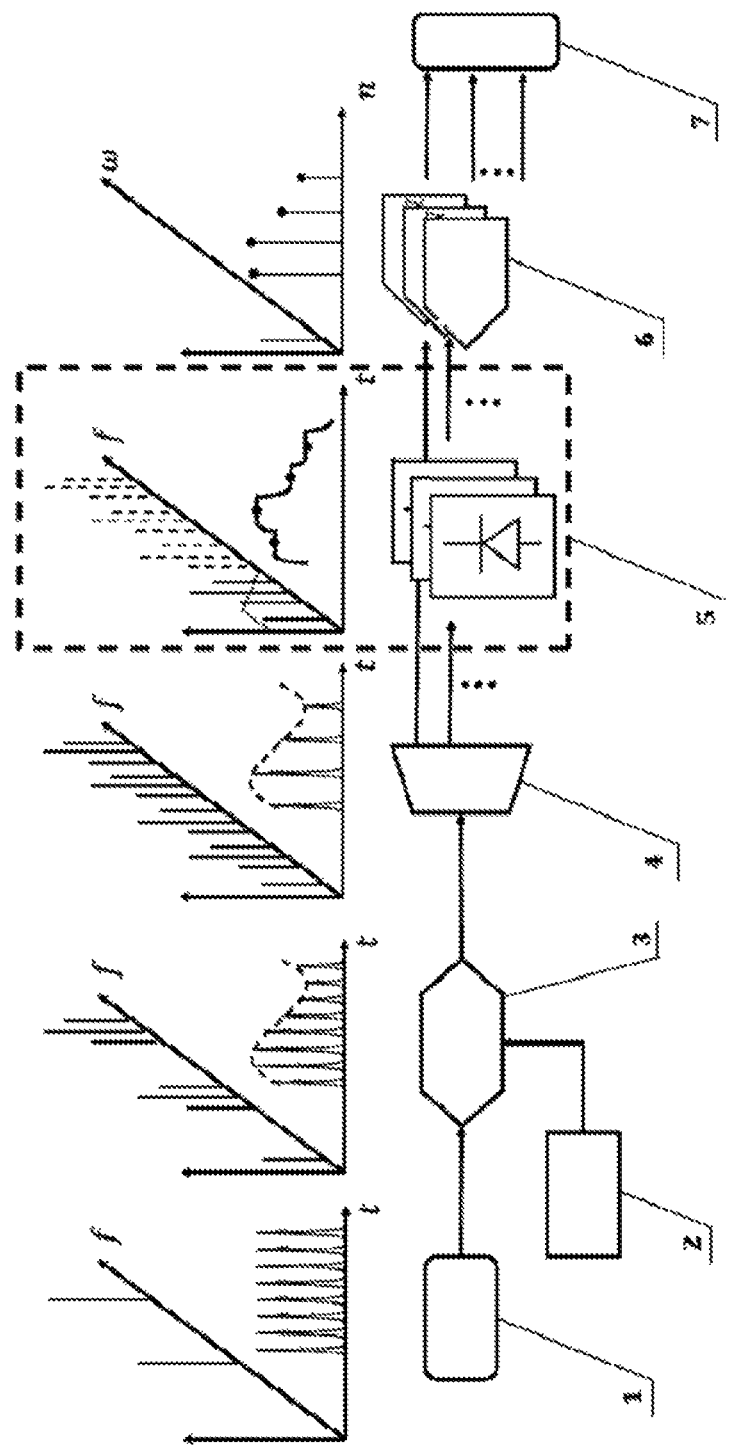
FIG. 1 is a diagram showing the overall architecture of one embodiment of the photonic analog-to-digital conversion method of the present invention. Reference numbers refer to the following: 1—light source; 2—sampled signal source; 3—sampling gate; 4—demultiplexer; 5—photodetector array; 6—electronic analog-to-digital converter; 7—data processing.
Figure 2:
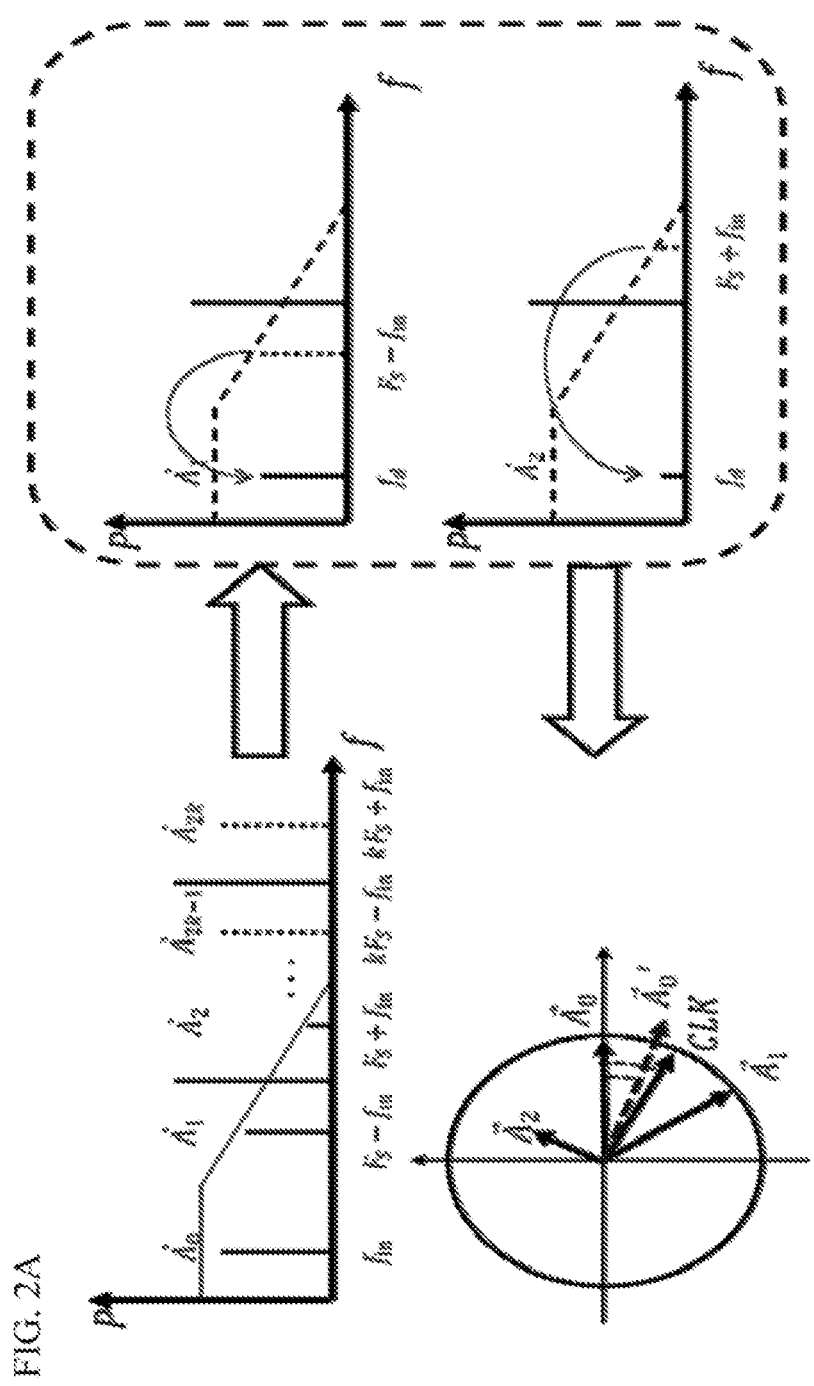
FIGS. 2A to 2C show calculation process of a sampling and holding effect in frequency domain in the present invention, where
Figure 3:
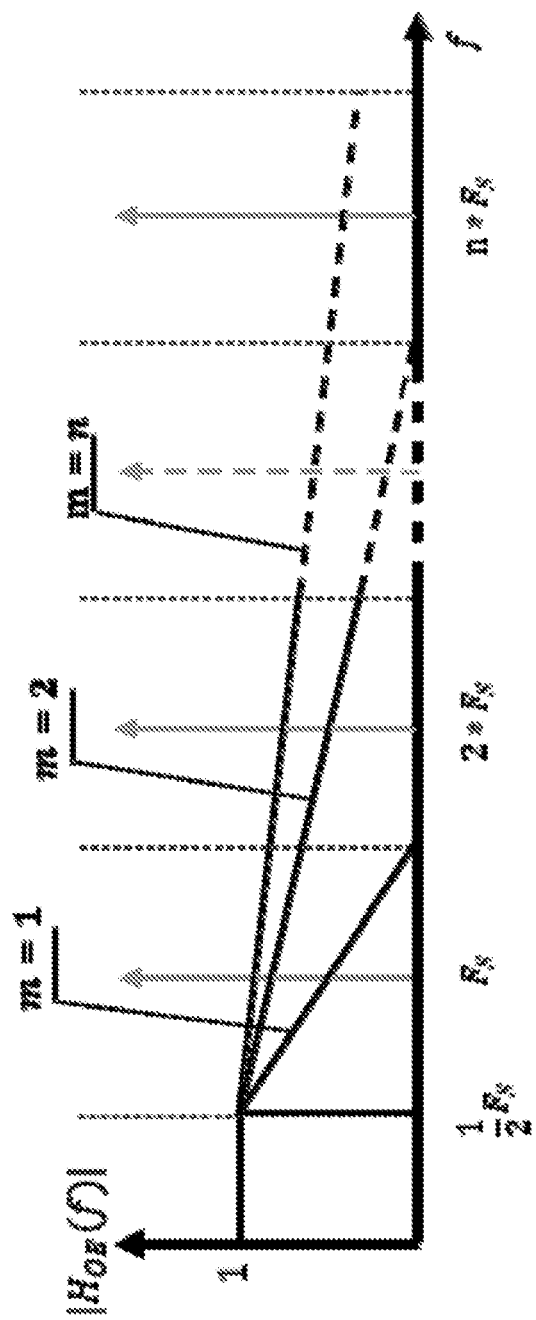
FIG. 3 is a schematic diagram showing a set of frequency responses in the present invention as in formula (6), where m is positive integer greater than or equal to 1.

As shown in FIG. 1, based on an interconnection mode of a traditional channel interleaved photonic analog-to-digital conversion architecture, the present invention comprises an optical sampling clock source 1, a sampled signal source 2, a photonic sampling gate 3, a demultiplexer array 4, a photodetector array 5, an electronic analog-to-digital converter array 6, and a data integration and processing module 7. After determining a sampling rate $N*F_s$ and the number N of channels of the entire channel interleaved photonic analog-to-digital conversion system, a sampling rate of a single channel is $F_s$, and a 3 dB bandwidth of a photodetector in the traditional architecture is half of the sampling rate of a single channel, i.e., $F_s/2$. In the embodiment of the present invention, based on the aforementioned formula (5), the key to obtaining a time mismatch counteraction effect is to retain high-frequency components generated by a sampled signal in a single channel. Amplitude-frequency responses of the photodetectors as shown in the following formula are used, and their 3 dB bandwidths are set to be the sampling rate of a single channel, i.e., $F_s$. In a frequency spectrum of a single channel, in addition to a signal within the Nyquist bandwidth, two high-frequency components symmetrical to the sampling rate are retained, that is, m=1 in formula (6).

$$|H_{OE}(f)| = \begin{cases} 1, & 0 \le f \le \frac{1}{2}F_s \\ 1 - \frac{1}{F_s}(f - \frac{1}{2}F_s), & \frac{1}{2}F_s < f \le \frac{1}{2}F_s + F_s \\ 0, & \text{otherwise} \end{cases} \quad (7)$$

Figure 4A:
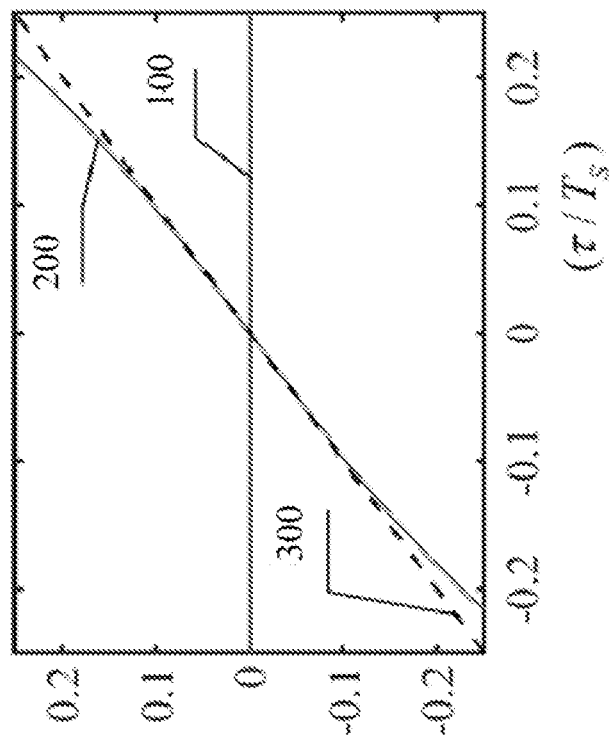
FIGS. 4A and 4B show simulation result in one embodiment of the present invention with a time mismatch added to a two-channel channel interleaved photonic analog-to-digital conversion system, where
Figure 4B:
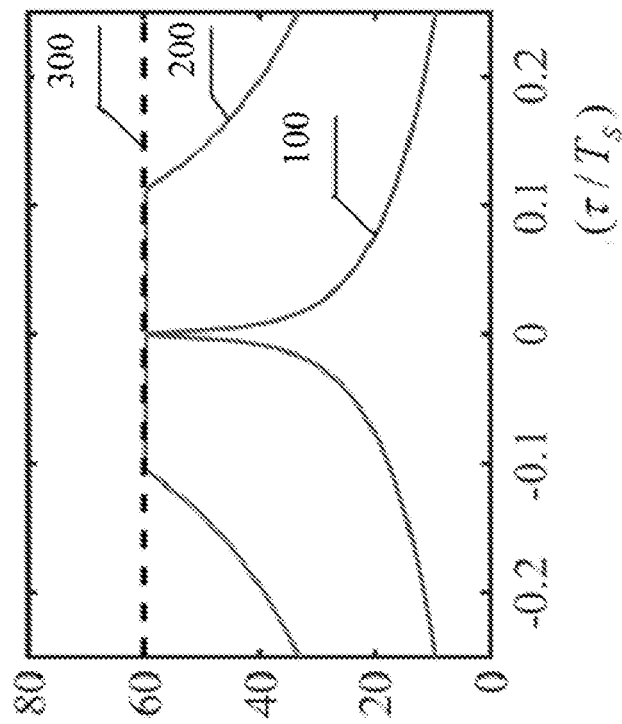

Based on basic principles of the channel interleaved photonic analog-to-digital converters, whose actual implementations all are from the extension based on a two-channel photonic analog-to-digital conversion system, the above-mentioned photodetectors with controlled frequency response are used for two-channel photonic analog-to-digital converters, and their signal holding effect is verified by simulation. In the two-channel channel interleaved analog-to-digital converters, when input signals are single-frequency signals, a time mismatch will cause the inclusion of a large spurious signal in a frequency spectrum of output data in addition to original input signals. The power of the spurious signal is proportional to the square of the time mismatch, so a signal-to-noise ratio of a final spectrum can reflect the size of a remaining time mismatch, thereby reflecting a sampling and holding effect. In the simulation of the embodiment, the number N of channels of the photonic analog-to-digital conversion system is set to be 2, the sampling rate $F_s$ of a single channel is set to be 5 GSPS, a total sampling rate is set to be 10 GSPS, and frequency spectrum responses of the used photodetectors can be derived by formula (7). A noise floor of the system is set to be 60 dBm, the powers of input signals are set to be 0 dBm, and it can be seen that an upper limit of the signal-to-noise ratios is 60 dB. A time mismatch of −50 ps-50 ps and step 1 ps is added to one of the channels, and signal-to-noise ratios are respectively calculated. In the same situation, compared with photodetectors with rectangular amplitude-frequency response in the current technology, results are shown in FIGS. 4A and 4B, where FIG. 4A shows the variation of the size of the equivalent delay with time mismatch, and FIG. 4B shows the improvement effect of a spurious-free dynamic range. In the two figures, 100 is a photonic analog-to-digital conversion system using photodetectors with low-pass filtering frequency response, 200 is a photonic analog-to-digital conversion system using photodetectors with controlled frequency response, and 300 is a photonic analog-to-digital conversion system in which the time mismatch is completely suppressed under ideal conditions. It can be seen that a small time mismatch can lead to a significant reduction in signal-to-noise ratio in the prior art. The control of the frequency responses of the photodetectors based on the method proposed in the invention can make the photonic analog-to-digital conversion system unaffected by the time mismatch within a certain range, which is equivalent in time domain to holding optical sampling pulse points for ±20 ps, about 0.2 sampling periods.

The implementation method of the above photonic analog-to-digital conversion architecture based on photonic parallel sampling of the present invention comprises the following steps:

(1) determining the sampling rate $N*F_s$ and the number N of channels according to the channel interleaved photonic analog-to-digital conversion system architecture;

(2) proposing the achievable frequency responses according to formula (6) and actual bandwidth requirements, which should meet two conditions: the high-frequency components generated by pulse sampling should be retained in pairs; the 3 dB bandwidths should be equal to an integer multiple of the Nyquist bandwidth of a single channel, that is, in formula (6), m is set to be a positive integer greater than or equal to 1, and a corresponding photodetector array is used in the system;

wherein, on the other hand, phase frequency responses are held to be linear phases, a corresponding photodetector array is used in the system, and the obtained N channels of optical pulse sequences are input into N PD units with controlled frequency response to obtain N channels of held electrical signals which are then passed through N electronic analog-to-digital converters with synchronous sampling to obtain N channels of electrical digital signals; and (3) passing the obtained N channels of electrical signals through the N electronic analog-to-digital converters to obtain N channels of electrical digital signals that are input into the data integration and processing module, which performs the data reconstruction, interleaving and processing of the received N channels of electrical digital signals to obtain the information about the original electrical analog signals.

In the above process, basic architecture settings of the channel interleaved photonic analog-to-digital converters are retained, and appropriate frequency responses of photoelectric conversion are selected according to the proposed equivalent sampling and holding principles, so as to achieve a holding effect on each channel of demultiplexed signals, thereby counteracting sampling errors caused by the time mismatch. Experiments show that the present invention enables the photonic analog-to-digital conversion system to counteract the time mismatch between sampling and quantization in any sub-channel. At the same time, the controlled frequency responses of photoelectric conversion do not lead to additional expenses on active devices and software, which greatly improves performances of the photonic analog-to-digital conversion system. Based on the channel interleaved photonic analog-to-digital conversion architecture, the present invention simplifies the compensation mode of time mismatch, is not limited by the number of channels, and can provide more reliable technical solutions for realizing a photonic analog-to-digital conversion system with high sampling rate in the future.

We claim:

1. An optical sampling signal holding method for a photonic analog-to-digital conversion system comprising photodetectors and electronic analog-to-digital converters, comprising
controlling frequency responses of photodetectors to selectively retain and filter out high-frequency components of signals generated by optical pulse sampling,
folding back the high-frequency components to signal frequency positions when quantified by the electronic analog-to-digital converters of a same rate, and creating a time offset opposite to a time mismatch to counteract time mismatch and to obtain signal outputs without time mismatch.

2. The optical sampling signal holding method according to claim 1, comprising
   (1) assuming that sampled signals are single-tone signals with a frequency of $f_{in}$, sampling the signals by optical pulses with a repetition frequency of $F_s$, so as to result in a periodic extension in spectrum and generate many high-frequency components other than the original signals; these high-frequency components exist symmetrically with the multiple $kF_s$ of the optical pulse sampling rate as a center, and the frequency is $kF_s \pm f_{in}$, where k is positive integer greater than or equal to 1 and less than or equal to the number of harmonics of an optical sampling clock;
   (2) controlling frequency responses $|H_{OE}(f)|$ of the photodetectors, as shown in the following formula:

$$|H_{OE}(f)| = \begin{cases} 1, & \text{if } 0 \leq f \leq \frac{1}{2} \cdot F_S \\ 1 - \frac{1}{m \cdot F_S} \cdot (f - \frac{1}{2} \cdot F_S), & \text{if } \frac{1}{2} \cdot F_S \leq f \leq m \cdot F_S + \frac{1}{2} \cdot F_S \\ 0, & \text{otherwise} \end{cases}$$

wherein f is independent variable of the frequency response expression, m is the number of retained high-frequency component pairs and is positive integral greater than or equal to 1; and
   (3) inputting optical pulses into the photodetectors with controlled frequency response to obtain held electrical signals, and passing the held electrical signals through the electronic analog-to-digital converters to obtain electrical digital signals.

3. The optical sampling signal holding method according to claim 2, wherein m is 1 in the frequency response expression $|H_{OE}(f)|$.

4. The optical sampling signal holding method according to claim 2, further comprising
   adding filters that conform to the frequency responses after the photodetectors.

5. The optical sampling signal holding method according to claim 2, further comprising
   (4) performing a direct-current removal and data reconstruction and interleaving of the electrical digital signals to obtain quantization results without time mismatch of the original electrical analog signals.

6. The optical sampling signal holding method according to claim 1, wherein the photonic analog-to-digital conversion system comprises an optical sampling clock source, a sampled signal source, a photonic sampling gate, a demultiplexer array and a data integration and processing module; the photodetectors are composed of N PD units in parallel; and the electronic analog-to-digital converters are composed of N electronic analog-to-digital converters in parallel;
   wherein an output end of the optical sampling clock source is connected to an input end of the photonic sampling gate, an output end of the photonic sampling gate is connected to an input end of the demultiplexer, N output ends of the demultiplexer are connected to input ends of the N PD units, output ends of the N PD units are respectively connected to input ends of the N electronic analog-to-digital converters, and output ends of the electronic analog-to-digital converters are respectively connected to N input ends of the data integration and processing module, wherein, N is a positive integral greater than or equal to 1.

* * * * *